US009755625B2

(12) United States Patent
Song et al.

(10) Patent No.: US 9,755,625 B2
(45) Date of Patent: Sep. 5, 2017

(54) PULSE GENERATOR AND DRIVING CIRCUIT COMPRISING THE SAME

(71) Applicant: FAIRCHILD KOREA SEMICONDUCTOR LTD., Bucheon-si (KR)

(72) Inventors: Kinam Song, Seoul (KR); Wonhi Oh, Bucheon-si (KR); Jinkyu Choi, Bucheon-si (KR); Taesung Kwon, Seoul (KR); Seunghyun Hong, Seoul (KR)

(73) Assignee: Fairchild Korea Semiconductor Ltd., Bucheon (KR)

( * ) Notice: Subject to any disclaimer, the term of this patent is extended or adjusted under 35 U.S.C. 154(b) by 0 days.

(21) Appl. No.: 14/699,732

(22) Filed: Apr. 29, 2015

(65) Prior Publication Data

US 2015/0318855 A1  Nov. 5, 2015

Related U.S. Application Data

(60) Provisional application No. 61/986,261, filed on Apr. 30, 2014.

(30) Foreign Application Priority Data

Apr. 9, 2015 (KR) ........................ 10-2015-0050485

(51) Int. Cl.
| | |
|---|---|
| *H03K 3/00* | (2006.01) |
| *H03K 5/12* | (2006.01) |
| *H03K 19/00* | (2006.01) |
| *H03K 19/0175* | (2006.01) |
| *H03K 19/003* | (2006.01) |

(52) U.S. Cl.
CPC ........... *H03K 5/12* (2013.01); *H03K 19/0013* (2013.01); *H03K 19/00369* (2013.01); *H03K 19/0175* (2013.01); *H03K 19/017509* (2013.01)

(58) Field of Classification Search
CPC ........................................................ H03K 5/12
See application file for complete search history.

(56) References Cited

U.S. PATENT DOCUMENTS

| | | | |
|---|---|---|---|
| 6,271,713 B1 * | 8/2001 | Krishnamurthy | H03K 19/01721 327/112 |
| 6,326,831 B1 | 12/2001 | Kumagai | |
| 6,524,455 B1 * | 2/2003 | Sellers | C23C 14/54 204/298.08 |
| 6,747,502 B2 | 6/2004 | Yamamoto | |
| 2009/0251220 A1 * | 10/2009 | Matsuda | H03F 1/0261 330/296 |
| 2011/0187439 A1 * | 8/2011 | Sugie | H03K 17/687 327/424 |
| 2013/0229207 A1 | 9/2013 | Tseng et al. | |

* cited by examiner

Primary Examiner — Daniel Puentes (57) ABSTRACT

A pulse generator includes a first inverter configured to inverse an input pulse and output a result, a second inverter configured to inverse the output of the first inverter and output a result, a clamp inverter configured to generate a clamping voltage by clamping the output of the second inverter and generate an output pulse through a source follower which operates according to the clamping voltage, and a temperature compensator configured to compensate for variations in the clamping voltage caused by temperature change.

14 Claims, 10 Drawing Sheets

PULSE GENERATOR AND DRIVING CIRCUIT COMPRISING THE SAME

CROSS-REFERENCE TO RELATED APPLICATION

This application claims priority from U.S. Patent Provisional Application No. 61/986,261, filed on Apr. 30, 2014, in the United States Patent & Trademark Offices (USPTO), and Korean Patent Application No. 10-2015-0050485, filed with the Korean Intellectual Property Office on Apr. 9, 2015, the entire contents of which are incorporated herein by reference.

BACKGROUND

1. Field

Embodiments of the present disclosure relate to a pulse generator configured to supply gate voltage to a level shift circuit to drive a high voltage device, and a driving circuit comprising the same.

2. Discussion of Related Art

It is necessary to reduce power consumption for level shift, in order to efficiently drive a high voltage device on a high side. The circuits to drive high voltage devices such as IGBT or MOSFET (hereinafter, "gate driving circuit") include level shifters.

The high side level shifter is biased by high voltage, and transistors constituting the level shifter are driven by the high gate-source voltage. Accordingly, the transistors of the level shifter are implemented as high-voltage devices. As the gate-source voltage supplied to the level shifter increases, the possibility increases that the transistors of the level shifter operate outside the safe operating area (SOA).

SUMMARY

A technical objective of the present disclosure is to provide a pulse generator which reduces power consumption of a level shifter and controls operation of the level shifter stably, and a driving circuit comprising the same.

In an embodiment, a pulse generator may include a first inverter configured to inverse an input pulse and output a result, a second inverter configured to inverse an output of the first inverter and output a result, and a clamp inverter configured to generate a clamping voltage by clamping an output of the second inverter and generate an output pulse through a source follower which operates according to the clamping voltage.

The clamp inverter may include a first zener diode including a cathode coupled to the output of the second inverter, and a first transistor including a gate coupled to the output of the second inverter, a first electrode coupled to an output node of the clamp inverter, and a second electrode coupled to a first voltage, the first transistor implementing the source follower.

The clamp inverter may additionally include a second zener diode coupled between the output node and a ground.

The clamp inverter may additionally include a second transistor coupled between the output node and a ground, to switch according to the output of the first inverter.

The first and the second transistors may be NMOS transistors.

The pulse generator may additionally include a temperature compensator configured to compensate for variations in the clamping voltage caused by a temperature change.

The clamp inverter may include a first zener diode coupled between the output of the second inverter and the temperature compensator. The temperature compensator may be coupled to an anode of the first zener diode, and may have a polarity opposite to a temperature coefficient of the first zener diode according to a temperature rise.

The temperature compensator may include a first electrode coupled to a ground, a second electrode coupled to an anode of the first zener diode, and a third transistor which is diode-connected. The third transistor may be a MOSFET. Alternatively, the third transistor may be a BJT.

The clamp inverter may include a first zener diode coupled between the output of the second inverter and the temperature compensator. The temperature compensator may include one or more diodes including an anode coupled to an anode of the first zener diode.

The second inverter may include a fourth transistor coupled between the first voltage and the output of the second inverter, to switch according to the output of the first inverter, and a fifth transistor coupled between the output of the second inverter and a ground, to switch according to the output of the first inverter.

The pulse generator may additionally include a current source coupled between the first voltage and the fourth transistor to supply a constant current.

The current source may include a first electrode coupled to the first voltage, a second electrode coupled to the fourth transistor, and a sixth transistor including a gate to which a predetermined voltage is inputted.

The clamp inverter may include a plurality of diodes coupled between the output of the second inverter and a ground, and a first transistor including a gate coupled to the output of the second inverter, a first electrode coupled to an output node of the clamp inverter, and a second electrode coupled to a first voltage, in which the first transistor may implement the source follower.

The clamp inverter may also include a current source coupled between the output of the second inverter and a ground, and a first transistor including a gate coupled to the output of the second inverter, a first electrode coupled to an output node of the clamp inverter, and a second electrode coupled to a first voltage, in which the first transistor may implement the source follower.

In an embodiment, a driving circuit may include a pulse generator including a first zener diode and a source follower, and a level shifter. The pulse generator may be configured to generate a clamping voltage by clamping a signal corresponding to an input pulse through the first zener diode. The source follower may operate according to the clamping voltage to generate the output pulse. The level shifter may include a high voltage device coupled between a high voltage and a ground, to switch according to the output pulse to shift level of the output pulse and output a result.

The source follower may include a first transistor including a gate to which the clamping voltage is inputted, a first electrode coupled to an output node of the pulse generator, and a second electrode coupled to a first voltage.

The pulse generator may additionally include a second transistor coupled between an output node of the pulse generator and a ground, to switch according to a signal which is inverted from the input pulse.

A signal corresponding to the input pulse may be supplied to a cathode of the first zener diode, and the pulse generator may additionally include a temperature compensator which is coupled to an anode of the first zener diode, and which has a polarity opposite to a temperature coefficient polarity of the first zener diode.

The temperature compensator may include a third transistor which may be diode-connected, and which may include a first electrode coupled to a ground, and a second electrode coupled to an anode of the first zener diode.

The temperature compensator may include one or more diodes, and an anode of the one or more diodes may be coupled to an anode of the first zener diode.

The pulse generator may additionally include a fourth transistor coupled between a first voltage and a cathode of the first zener diode, to switch according to a signal which is inverted from the input pulse, and a current source coupled between the first voltage and the fourth transistor to supply constant current.

Accordingly, a pulse generator and a driving circuit are provided, which can reduce power consumption of the level shifter and also stably control operations of the level shifter.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

The present invention will be described more fully hereinafter with reference to the accompanying drawings, in which exemplary embodiments of the invention are shown. Exemplary embodiments of the present invention are described below in sufficient detail to enable those of ordinary skill in the art to embody and practice the present invention. This invention may, however, be embodied in different forms and should not be construed as limited to the embodiments set forth herein. In the descriptions of the present invention, known configurations that are not related to the gist of the present invention may be omitted. With the addition of reference numerals in components of each drawing, like numerals refer to like components throughout the specification.

Throughout the specification, it will be understood that when an element is referred to as being "connected" or "coupled" to another element, it can be "directly connected" or "coupled" to the other element or may be "electrically connected" or "electrically coupled" via intervening elements which may be present. Further, unless otherwise stated to the contrary, it will be understood that the terms "comprises," "comprising," "includes," and/or "including," when used herein, specify the presence of other elements rather than foreclosing the same.

Figure 1:
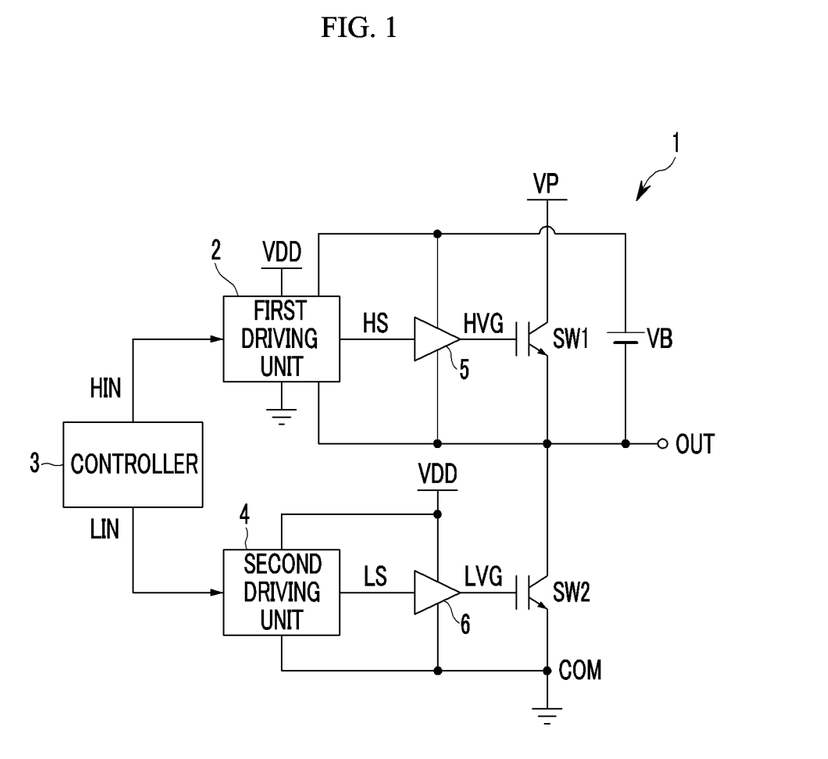
FIG. 1 is a diagram of a half-bridge power supply device, to which a pulse generator is applicable according to an embodiment.

FIG. 1 is a diagram of a half-bridge power supply device, to which a pulse generator is applicable according to an embodiment.

For example, a pulse generator according to an embodiment may be implemented for a first driving unit 2. Referring to FIG. 1, a power supply 1 includes a high side switch SW1, a low side switch SW2, a first driving unit 2, a controller 3, a second driving unit 4, a high side gate driving circuit 5, and a low side gate driving circuit 6.

Voltage VP is connected to a collector of the switch SW1, an emitter of the switch SW1 and a collector of the switch SW2 are connected to an output (OUT), and an emitter of the switch SW2 is connected to ground.

Voltage HVG is inputted to a gate of the switch SW1, and the gate driving circuit 5 generates the voltage HVG according to the voltage HS of the first driving unit 2. Voltage LVG is inputted to the gate of the switch SW2, and the gate driving circuit 6 generates voltage LVG according to the voltage LS of the second driving unit 4. The controller 3 generates a first input signal HIN to control the first driving unit 2 and a second input signal LIN to control the second driving unit 4.

Voltage VDD is supplied to the first driving unit 2. The first driving unit 2 is connected between high voltage VB and the output (OUT), and generates voltage HS according to the first input signal HIN. The second driving unit 4 is connected between the voltage VDD and the ground and generates voltage LS according to the second input signal LIN.

The first input signal HIN and the second input signal LIN may be the signals with opposite phases to each other, and accordingly, the switches SW1 and SW2 may switch alternately.

The pulse generator according to an embodiment may be implemented for the first driving unit 2 which is connected to the high voltage VB.

Figure 2:
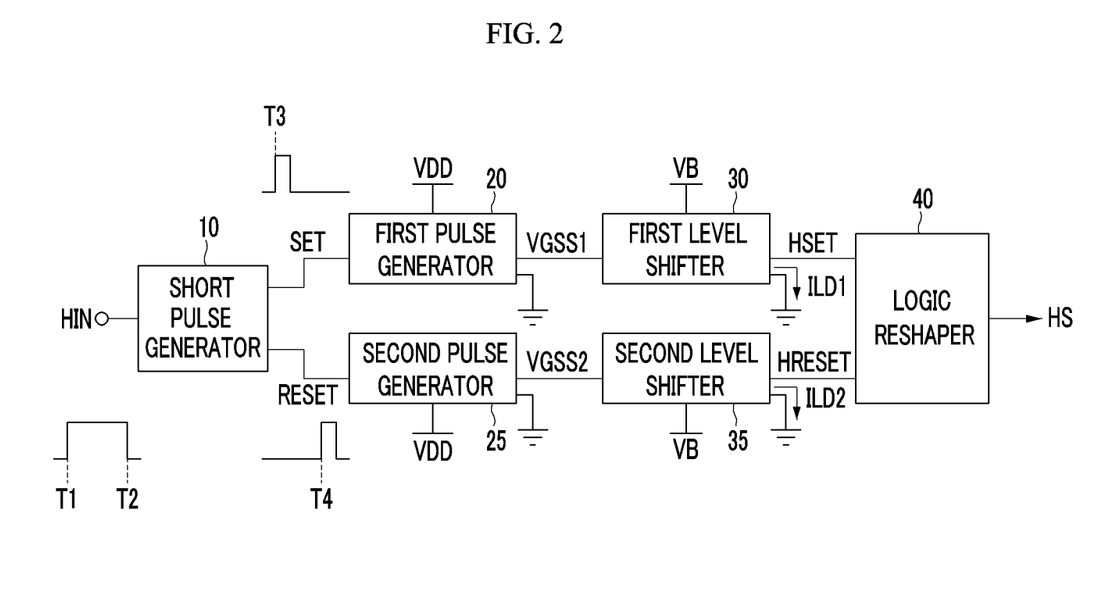
FIG. 2 is a block diagram of a first driver.

FIG. 2 is a block diagram of the first driving unit.

The first driving unit 2 includes a short pulse generator 10, a first and a second pulse generators 20, 25, a first and a second level shifters 30, 35, and a logic reshaper 40.

The short pulse generator 10 generates a signal SET and a signal RESET according to the first input signal HIN. For example, the short pulse generator 10 in synchronization with the rising edge of the first input signal HIN at time point T1 generates a shirt pulse signal SET at time point T3, while the short pulse generator 10 in synchronization with the falling edge of the first input signal HIN at time point T2 generates a short pulse signal RESET at time point T4.

The first pulse generator 20 generates pulse signal VGSS1 according to the signal SET and supplies the pulse signal VGSS1 to the first level shifter 30. The second pulse generator 25 generates pulse signal VGSS2 according to the signal RESET and supplies the pulse signal VGSS2 to the second level shifter 35.

The first level shifter 30 level-shifts the pulse signal VGSS1 of the first pulse generator 20 and outputs the same. At this time, the high voltage device of the first level shifter 30 is turned on according to the pulse signal VGSS1, and current ILD1 flows to the high voltage device.

The second level shifter 35 level-shifts the pulse signal VGSS2 of the second pulse generator 25 and outputs the same. At this time, the high voltage device of the second level shifter 35 is turned on according to the pulse signal VGSS2, and current ILD2 flows to the high voltage device.

The levels of the pulse signals (VGSS1, VGSS2) inputted to the first and second level shifters 30, 35 may be shifted to voltage levels suitable for the logic reshaper 40.

The logic reshaper 40 generates a signal HS of a level to turn on the switch SW1 according to an output from the first level shifter 30, and generates a signal HS of a level to turn off the switch SW1 according to an output from the second level shifter 35. For example, the logic reshaper 40 may generate a signal HS to turn on the switch SW1 in synchronization with the rising edge of the output signal HSET from the first level shifter 30, and the logic reshaper 40 may generate a signal HS to turn off the switch SW1 in synchronization with the rising edge of the output signal HRESET from the second level shifter 35.

According to embodiments, the pulse generator may be implemented for both the first and second pulse generators 20, 25.

Hereinbelow, a pulse generator according to various embodiments will be explained with reference to FIGS. 3 to 6.

Figure 3:
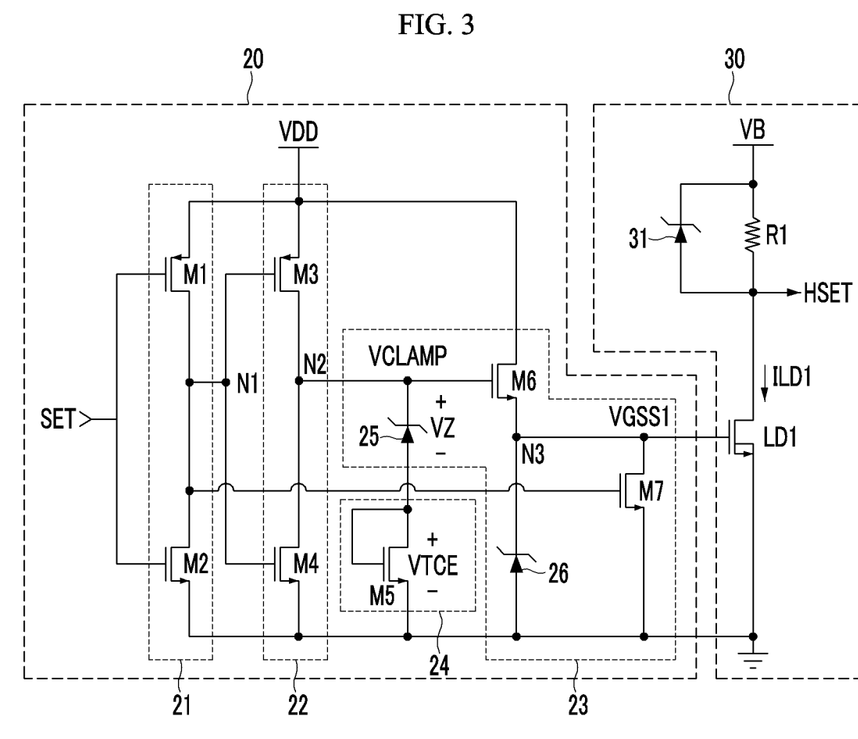
FIG. 3 is a diagram of a first pulse generator and a first level shifter according to a first embodiment.

FIG. 3 is a diagram of a first pulse generator and a first level shifter according to a first embodiment.

The first and second pulse generators 20, 25 have identical constitution, except for difference in inputs and outputs thereof. For example, when a signal RESET is inputted instead of the signal SET illustrated in FIG. 3 to the second pulse generators 25, the pulse signal VGSS2, instead of the pulse signal VGSS1, may be outputted from the second pulse generators 25.

The first and second level shifters 30, 35 have identical constitution, except for difference in inputs and outputs thereof. For example, when a pulse signal VGSS2 is inputted instead of the pulse signal VGSS1 illustrated in FIG. 3 to the second level shifters 35, the signal HRESET, instead of the signal HSET, may be outputted from the second level shifters 35.

Accordingly, the same operation, which is described above with reference to the first pulse generator 20 by referring to FIG. 3, may also be applicable to the second pulse generator 25.

As illustrated in FIG. 3, the first pulse generator 20 includes two inverters 21, 22, a clamp inverter 23 and a temperature compensator 24.

The inverter 21 inverts the logic level of the signal SET and outputs the inverse signal, and the inverter 22 inverts the output from the inverter 21 and outputs the inverse signal.

The clamp inverter 23 clamps the output from the inverter 22, generates a clamping voltage VCLAMP, and generates a pulse signal VGSS1 through a source follower which operates according to the clamping voltage VCLAMP. The temperature compensator 24 compensates for the variations in the clamping voltage VCLAMP caused by temperature change.

The inverter 21 includes a transistor M1 and a transistor M2. The signal SET is inputted to a gate of the transistor M1 and to a gate of the transistor M2, and a source of the transistor M1 is connected to the voltage VDD. The source of the transistor M2 is connected to the ground, and a drain of the transistor M1 and a drain of the transistor M2 are connected to a node N1.

The transistor M1 is a p-channel transistor, and the transistor M2 is an n-channel transistor. Accordingly, the transistor M1 is turned on when the signal SET is low level, and the transistor M2 is turned on when the signal SET is high level. Accordingly, the logic level of the signal SET is inverted by the inverter 21, and the voltage of the node N1 is determined according to the inverse signal SET. For example, the voltage of the node N1 is ground level when the signal SET is high level, while the voltage of the node N1 is voltage (VDD) level when the signal SET is low level.

The inverter 22 includes a transistor M3 and a transistor M4. A gate of the transistor M3 and a gate of the transistor M4 are connected to the node N1, a source of the transistor M3 is connected to the voltage VDD, a source of the transistor M4 is connected to the ground, and a drain of the transistor M3 and a drain of the transistor M4 are connected to a node N2.

The transistor M3 is a p-channel transistor, and the transistor M4 is an n-channel transistor. Accordingly, the transistor M3 is turned on when voltage of the node N1 is low level, and the transistor M4 is turned on when the voltage of the node N1 is high level. Accordingly, the logic level of the signal SET is inverted by the inverter 21 and again inverted by the inverter 22, so that the voltage of the node N2 is determined.

For example, the voltage of the node N2 is voltage (VDD) level when the signal SET is high level, while the voltage of the node N2 is ground level when the signal SET is low level. Meanwhile, the voltage VDD may have a wide voltage range, and despite the wide voltage range of VDD, the pulse generator according to an embodiment may clamp the voltage of the node N2 to a predetermined voltage (hereinbelow, "clamping voltage VCLAMP").

The clamp inverter 23 may determine clamping the voltage VCLAMP using a zener diode 25 and may include a transistor M6 which determines output according to the determined clamping voltage VCLAMP. A cathode of the zener diode 25 is connected to the node N2, and an anode of the zener diode 25 is connected to the temperature compensator 24.

The transistors M6, M7 are NMOS transistors. At the same aspect ratio, the NMOS has larger current capacity than PMOS, and accordingly, the clamp inverter 23 is able to reduce propagation delay, while maintaining a lower pulse signal VGSS1 than one in a related art. Further, the substrates of the NMOS transistors M6, M7 may be tied to the sources of the transistors M6, M7 to remove body effect.

The gate of the transistor M6 is connected to the node N2, the drain is connected to the voltage VDD, and the source is connected to the node N3. The voltage of the node N3 is pulse signal VGGS1. As the voltage of the node N2 is clamped according to the zener voltage VZ of the zener diode 25, the clamping voltage VCLAMP is determined based on the zener voltage VZ.

As the transistor M6 is turned on according to the clamping voltage VCLAMP, the voltage of the node N3 becomes the clamping voltage VCLAMP. At this time, since the voltage VDD is connected to the node N3, the current necessary for the voltage of the node N3 to rise to the clamping voltage VCLAMP, is supplied from the voltage VDD. Accordingly, the time for the pulse signal VGSS1 to rise to the clamping voltage VCLAMP can be reduced. Accordingly, it is possible to reduce propagation delay which can be generated when controlling the pulse signal VGSS1 at a low level with the clamping voltage VCLAMP. Furthermore, it is also possible to reduce propagation delay of the pulse signal VGSS1 compared to a related art.

When the transistor M4 of the inverter 22 is turned on, the voltage of the node N2 becomes ground level so that the transistor M6 is turned off. At this time, the transistor M7 is turned on by the voltage of the node N1. Accordingly, the pulse signal VGSS1 is dropped to the ground level.

The cathode of the zener diode 26 is connected to the node N3, and the anode of the zener diode 26 is connected to the ground. Accordingly, the pulse signal VGSS1 may be clamped according to the zener voltage of the zener diode 26. As a result, it is possible to prevent gate-source overvoltage stress of the high voltage device LD1.

For example, when the pulse signal VGSS1 arises or falls with high dv/dt, a current may flow to the capacitance between the gate and the drain of the high voltage device LD1. In the absence of the zener diode 26, peak of the gate voltage may be generated in the high voltage LD1, and overvoltage may be generated between the gate and source of the high voltage device LD1. However, according to embodiments, even when currents flow to the capacitance between the gate and the drain of the high voltage device LD1, overvoltage is not generated, since the gate voltage of the high voltage device LD1 is clamped at the zener voltage of the zener diode 26.

The gate of the transistor M7 is connected to the node N1, the drain is connected to the node N3, and the source is connected to the ground. When the voltage of the node N1 is high level (i.e., when SET is low level), the transistor M7 is turned on, and the voltage of the node N3 is decreased to the ground level.

The temperature compensator 24 attenuates deviations of the clamping voltage VCLAMP caused due to temperature, by compensating for temperature characteristics of the zener diode 25. The zener diode 25 has such characteristic that the zener voltage VZ increases when the temperature rises. The temperature compensator 24 includes a device with a temperature characteristic opposite to the temperature characteristic of the zener diode 25.

As illustrated in the embodiment of FIG. 3, the temperature compensator 24 may be the transistor M5 which is an n-channel MOSFET to which diode is connected, but not limited thereto. For example, the temperature compensator 24 may be implemented as a different channel type transistor or a different type of transistor. The gate and the drain of the transistor M5 are connected, and the transistor M5 has decreasing gate-source voltage according to a negative temperature coefficient, as the temperature rises. Accordingly, even when the zener voltage VZ increases according to the positive temperature coefficient that increases according to the temperature rise, the gate-source voltage VTCE of the transistor M5 decreases, thus attenuating temperature deviation in the clamping voltage VCLAMP. Because the transistor M5 is connected to the diode, the gate-source voltage is a threshold voltage of the transistor M5. Accordingly, the clamping voltage VCLAMP is determined based on a sum (i.e., VZ+VTH_M5) of the zener voltage VZ and the threshold voltage of the transistor M5, where assume that a beta of the transistor M5 and a on resistance of transistor M3 are large.

When the transistor M3 is turned on and the transistor M6 is in source follower operation, the voltage of the node N3 is determined based on the clamping voltage CVLAMP subtracted by the threshold voltage of the transistor M6. That is, the high level of the pulse signal VGSS1 is VCLAMP-VTH_M6. When it is assumed that the clamping voltage VCLAMP is VZ+VTH_M5 and that the transistor M5 and the transistor M6 have an identical threshold voltage, the high level of the pulse signal VGSS1 is based on the zener voltage VZ.

As explained, according to an embodiment, the high level of the pulse signal VGSS1 can be controlled with the zener voltage VZ, so that it is possible to supply the gate voltage that is lower than one in a related art to the level shifter, and to fast increase the pulse signal VGSS1 with the source follower to thus reduce propagation delay.

The level shifter 30 shifts the level of the pulse signal VGSS1 to generate a signal HSET. The level shifter 30 includes a high voltage device LD1, a resistor R1, and a zener diode 31. According to an embodiment, the high voltage device LD1 may be implemented as a lateral double diffused MOS (LDMOS), but not limited thereto.

The voltage VB is supplied to one end of the resistor R1 whose other end is connected to the drain of the high voltage device LD1. The zener diode 31 is connected in parallel to the resistor R1 to clamp so that voltage at both ends of the resistor R1 does not exceed the zener voltage of the zener diode 31.

The pulse signal VGSS1 is inputted to the gate of the high voltage device LD1 whose source is connected to the ground. When the high voltage device LD1 is turned on by the pulse signal VGSS1, current ILD1 flows through the high voltage device LD1, and the signal HSET is generated, having voltage that corresponds to the voltage VB subtracted by the voltages at both ends of the resistor R1. When the high voltage device LD1 is turned off, the signal HSET is not generated.

Compared to a related art, the voltage of the pulse signal VGSS1 is lower so that the current ILD1 flowing through the high voltage device LD1 is decreased. As a result, the power consumption of the first level shifter 30 is reduced.

The first embodiment has been explained so far with reference to FIG. 3, which is also applicable to the second pulse generator 25 and the second level shifter 35.

The temperature compensator may include a variety of modifications.

Figure 4:
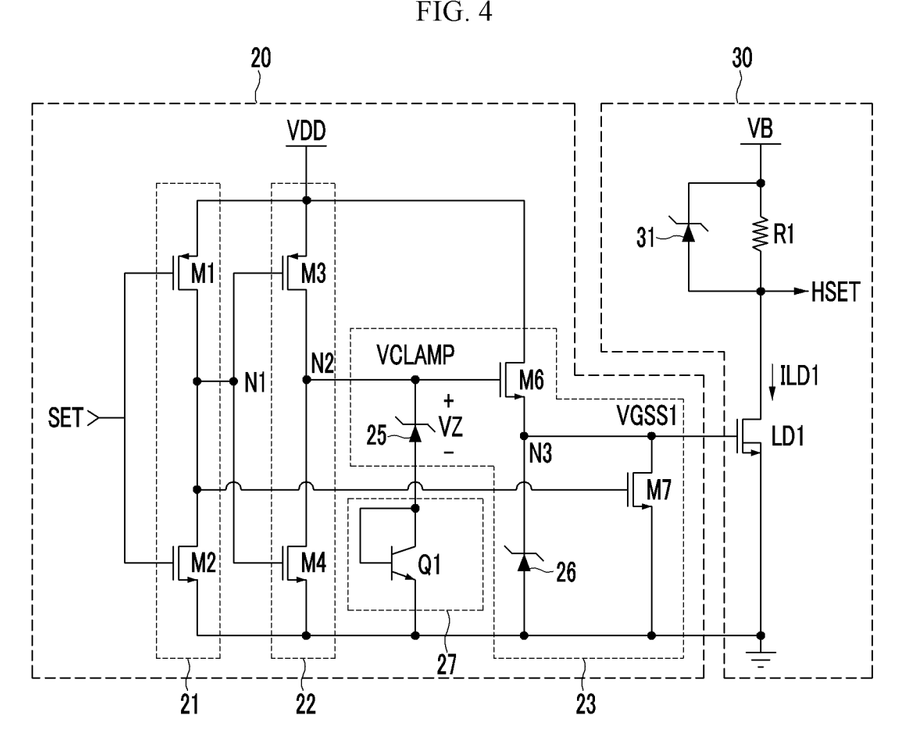
FIG. 4 is a diagram of a pulse generator according to a second embodiment.

For example, instead of the MOSFET transistor M5, a BJT transistor Q1 may be used.

FIG. 4 is a diagram of a pulse generator according to a second embodiment.

Herein, the like or similar elements to those of the first embodiment are referred to by the same reference numerals, and redundant explanation will be omitted for the sake of brevity.

The collector of the transistor Q1 is connected to the anode of the zener diode 25, the base and the collector are connected, and the emitter is connected to the ground. The base-emitter voltage of the transistor Q1 is decreased according to the negative temperature coefficient, as the temperature rises. Accordingly, the increase in the zener voltage VZ due to temperature rise can be compensated with the base-emitter voltage of the transistor Q1.

Figure 5:
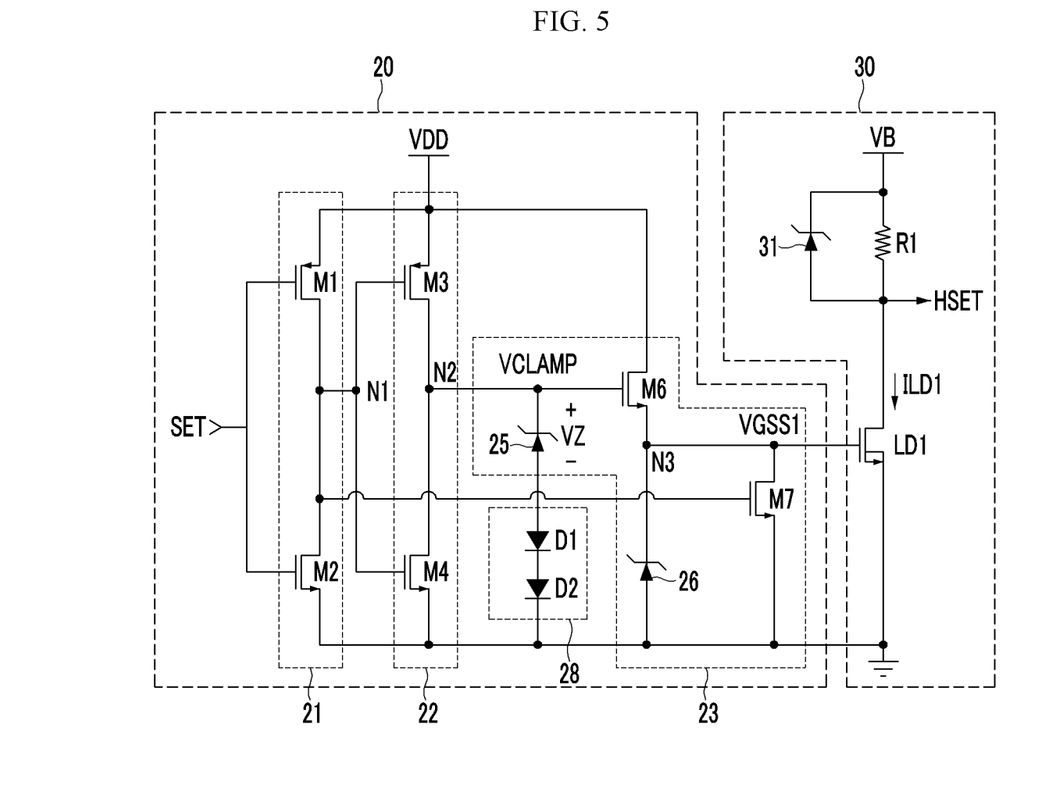
FIG. 5 is a diagram of a pulse generator according to a third embodiment.

FIG. 5 is a diagram of a pulse generator according to a third embodiment.

Herein, the like or similar elements to those of the first embodiment are referred to by the same reference numerals, and redundant explanation will be omitted for the sake of brevity.

The temperature compensator 28 includes two diodes D1, D2. As illustrated in FIG. 5, there may be two diodes D1, D2 connected in series, but an embodiment is not limited thereto. Accordingly, an appropriate number of diodes may be set in order to make up the temperature compensator 28, in consideration of the positive temperature coefficient of the zener diode 25 and the negative temperature coefficient of the diode.

The anode of the diode D1 is connected to the anode of the zener diode 25, the cathode of the diode D1 is connected to the anode of the diode D2, and the cathode of the diode D2 is connected to the ground.

When the two diodes D1, D2 are forward biased, respectively, forwarding voltage is generated between the anode and the cathode. The forwarding voltages of the two diodes D1, D2 are respectively decreased according to the negative temperature coefficient, as the temperature rises. Accordingly, it is possible to compensate the increase in the zener voltage VZ due to temperature rise, with the sum of the forwarding voltages of the two diodes D1, D2.

Figure 6:
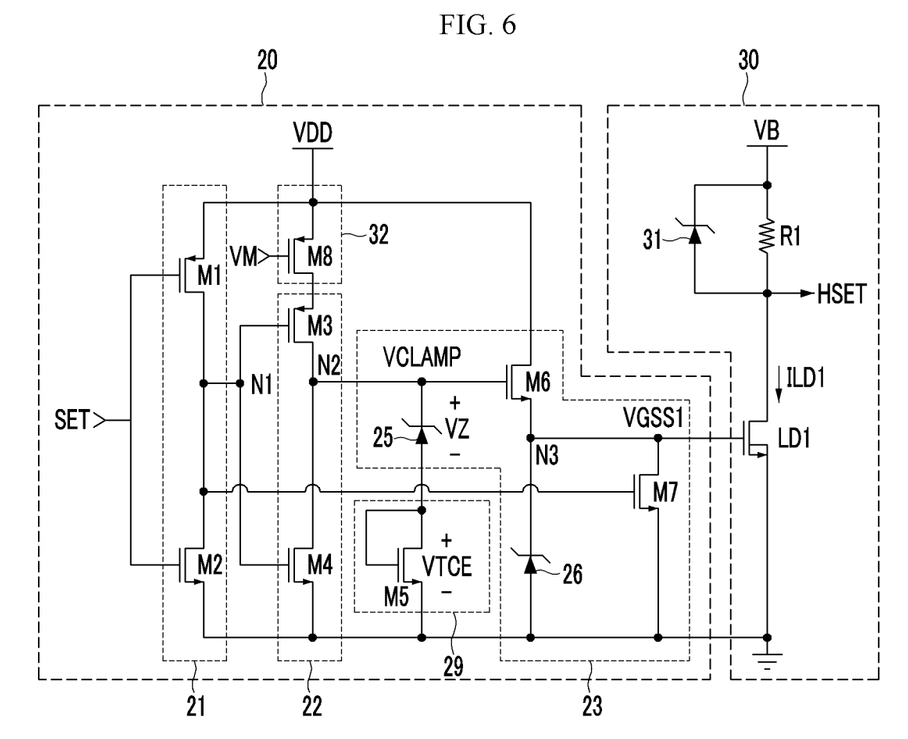
FIG. 6 is a diagram of a pulse generator according to a fourth embodiment.

FIG. 6 is a diagram of a pulse generator according to a fourth embodiment.

According to the fourth embodiment, the pulse generator may additionally include a current source to control the clamping voltage VCLAMP with increased accuracy. In the fourth embodiment, the current source 32 may be implemented as a transistor M8, but not limited thereto.

The source of the transistor M8 is connected to the voltage VDD, a predetermined voltage VM is inputted to the gate, and the drain is connected to the source of the transistor M3 of the inverter 22. The transistor M8 may be a p-channel transistor, but not limited thereto.

In the first to third embodiments explained above, the transistor M3 of the inverter 22 is turned on and the current flows through the transistor M3. In order to control the current flowing through the transistor M3, it is possible to adjust the impedance of the transistor M3. For example, the channel width size of the transistor M3 may be adjusted. Alternatively, a separate resistor may be connected between the transistor M3 and the node N2.

The current flowing through the transistor M3 flows through the zener diode 25 and the transistor M5 of the temperature compensator 29. Accordingly, the clamping voltage VCLAMP may vary according to the on-resistance of the transistor M3. Alternatively, when a separate resistor is connected, the clamping voltage VCLAMP may vary according to the on-resistance of the transistor M3 and the separate resistance.

For more accurate control, the pulse generator 20 according to the fourth embodiment may additionally include a current source 32 to supply a constant current.

When the transistor M3 is in ON state, a constant current of the current source 32 flows through the transistor M3, the zener diode 25 and the transistor M5. Accordingly, the zener voltage VZ is controlled to a constant voltage according to the current of the current source 32, and the clamping voltage VCLAMP can also be controlled to be constant.

In the fourth embodiment, the temperature compensator 29 may be implemented identically to the temperature compensator 24 of the first embodiment illustrated in FIG. 3, although the embodiments are not limited to any specific example only. Any of the temperature compensators 27, 28 illustrated in FIGS. 4 and 5 may be applied in the fourth embodiment.

As explained in the above embodiments, zener diodes may be employed for clamping purpose. However, the present disclosure is not limited to the above embodiments only. Accordingly, a plurality of diodes connected in series or a current source may be used instead of the zener diode.

Figure 7:
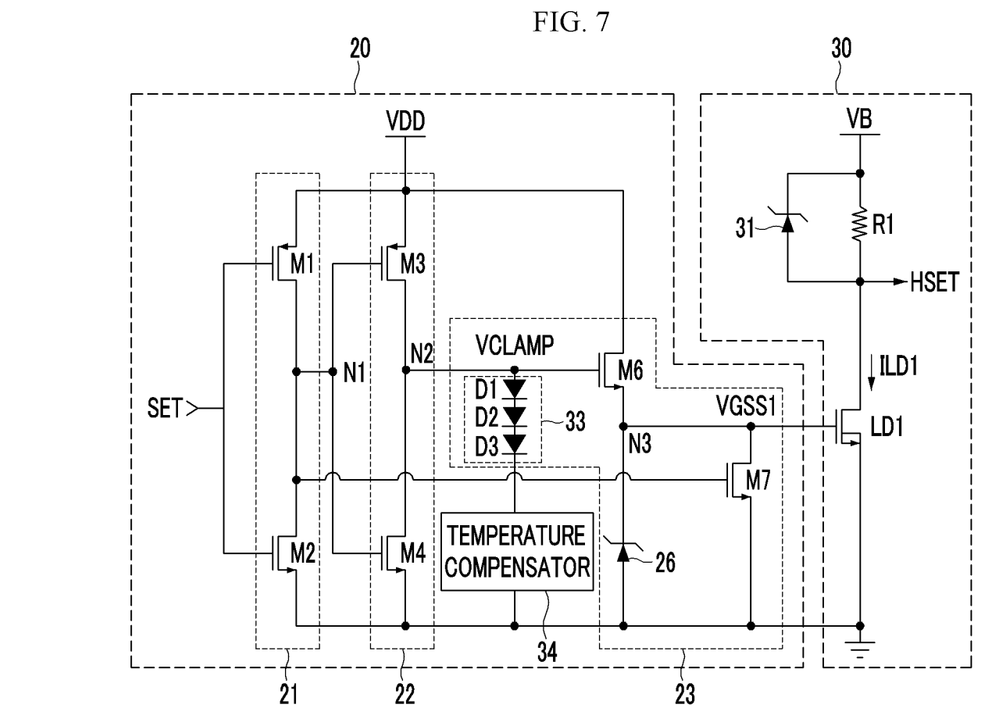
FIG. 7 is a diagram of a pulse generator according to the third embodiment.

FIG. 7 is a diagram of a pulse generator according to a fifth embodiment.

Referring to FIG. 7, a clamping circuit 33 to determine clamping voltage VCLAMP is connected to the gate of the transistor M6. As illustrated in FIG. 7, the clamping circuit 33 may consist of three diodes D1 to D3 connected in series, but not limited thereto.

When the three diodes D1 to D3 are forward biased, the clamping voltage VCLAMP is controlled according to the sum of the forward voltages of the three diodes D1 to D3. Accordingly, it is possible to control the clamping voltage VCLAMP by adjusting a number of the diodes.

The temperature compensator 34 may be implemented by using a device having a temperature coefficient with an opposite polarity to the temperature coefficient of the plurality of diodes D1 to D3, and may be connected between the clamping circuit 33 and the ground.

Figure 8:
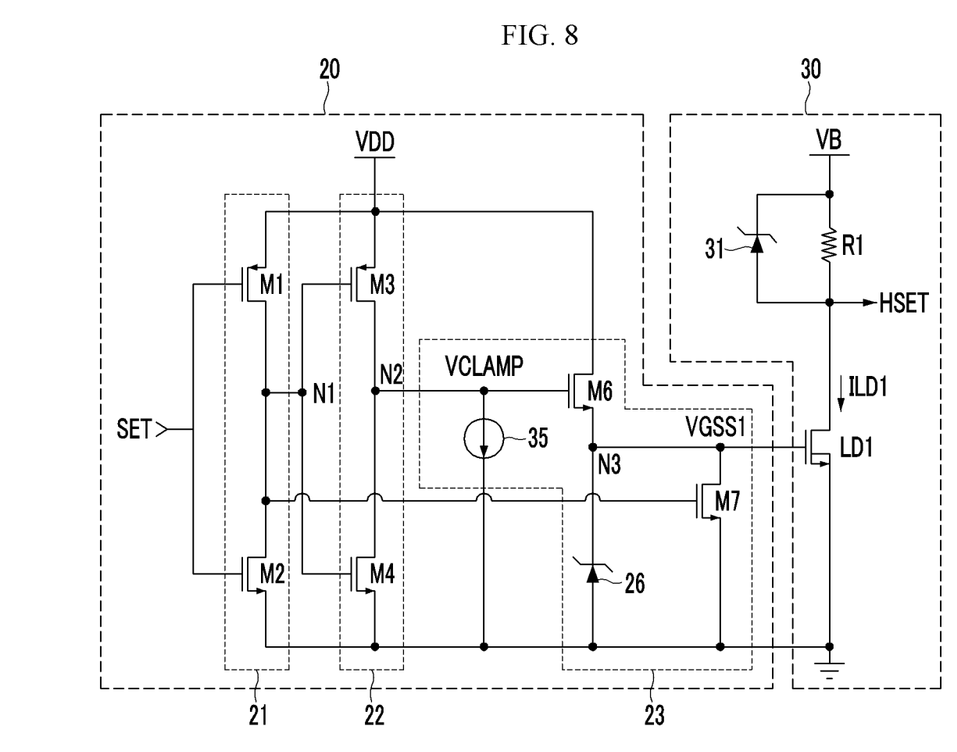
FIG. 8 is a diagram of a pulse generator according to a fourth embodiment.

FIG. 8 is a diagram of a pulse generator according to a sixth embodiment.

As illustrated in FIG. 8, a temperature-compensated current source 35 is connected to the gate of the transistor M6. When the transistor M3 is turned on and the current from the current source 35 is sunk to the ground, a predetermined voltage is dropped from the voltage VDD and the voltage of the node N2 is determined. That is, the voltage drop occurs due to resistance component between the voltage VDD and the node N2 and the current of the current source 35.

As explained, the voltage drop is adjusted according to the current of the current source 35, and thus the clamping voltage VCLAMP is determined. The current source 35 according to the sixth embodiment may be a constant current source, and it may not need a temperature compensator.

Figure 9:
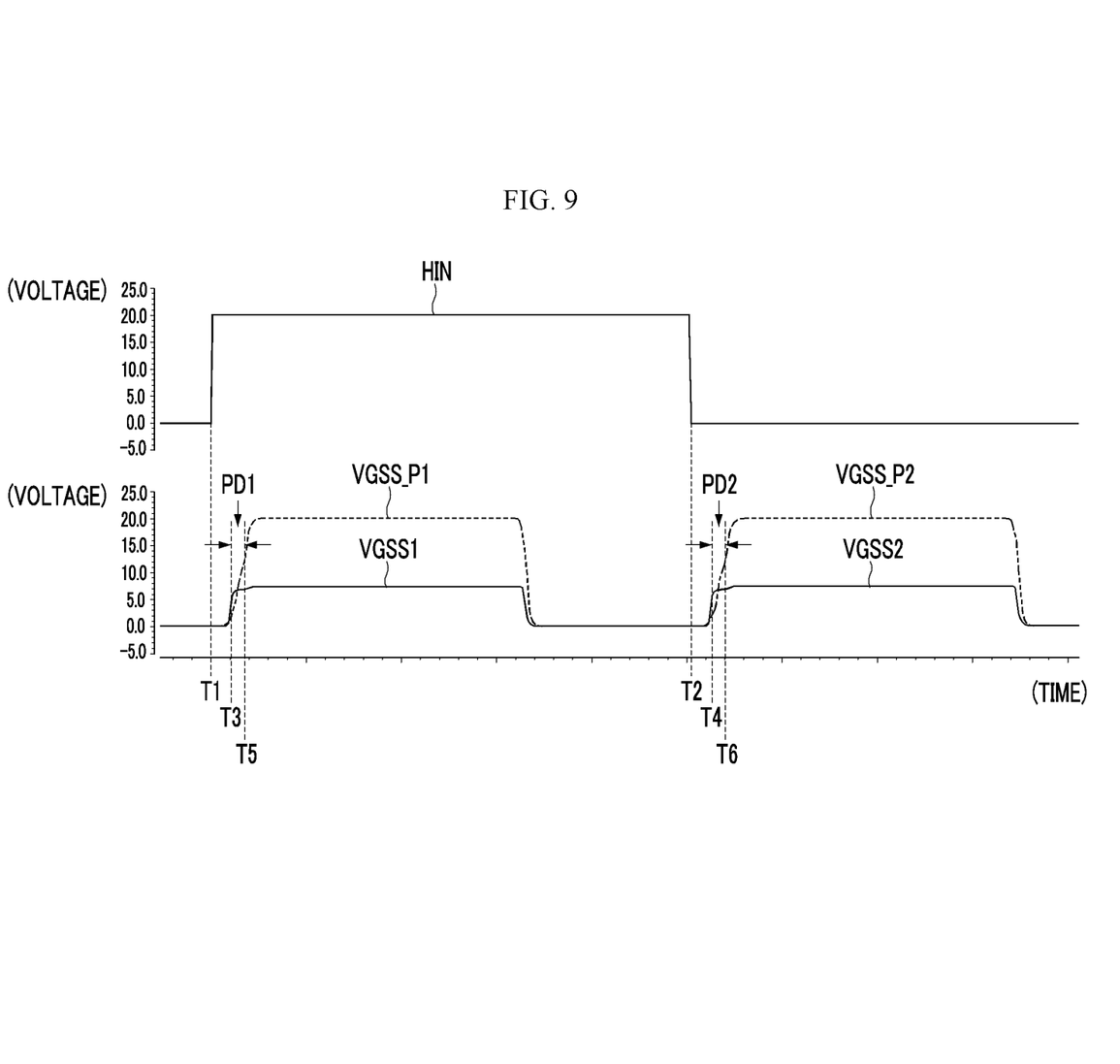
FIG. 9 shows waveforms of a first pulse signal and a second pulse signal according to embodiments.

FIG. 9 shows waveforms of a first pulse signal and a second pulse signal according to embodiments.

As illustrated in FIG. 9, signal HIN increases at time point T1, and the first pulse signal VGSS1 is increased to high level at time point T3. According to a related art, the first pulse signal VGSS_P1 is increased to high level at time point T5 which is delayed from time T3 as much as a period PD1.

According to the embodiments explained above with reference to FIGS. 3 to 8, the second pulse generator 25 may be implemented. In such example, the signal HIN decreases at time point T2, and the second pulse signal VGSS2 increases to high level at time point T4. According to a related art, the second pulse signal VGSS_P2 is increased to high level at time point T6 which is delayed from time point T4 as much as a period PD2.

As explained above, according to the embodiments, the gate voltage supplied to the high voltage device of the level shifter is lower and propagation delay is also reduced.

Figure 10:
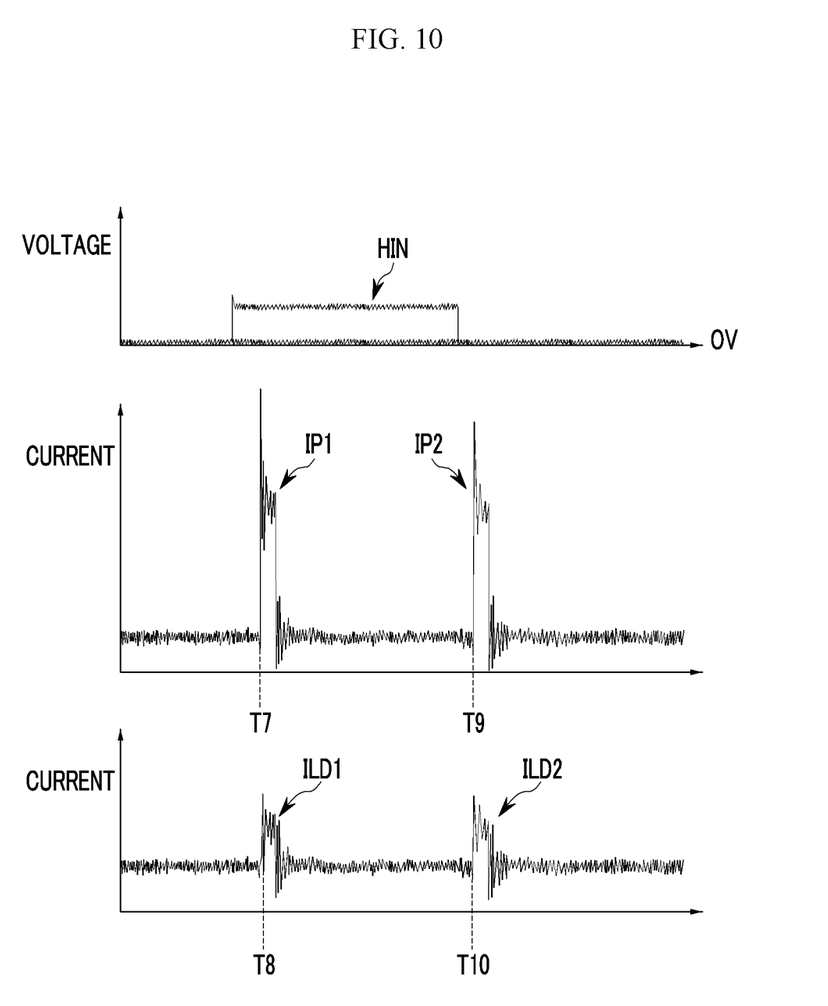
FIG. 10 is a waveform of current flowing through a level shifter.

FIG. 10 shows waveforms of the current flowing through the level shifter.

As illustrated in FIG. 10, the currents ILD1, ILD2 flowing through the first and second level shifters 30, 35 according to an embodiment respectively have lower peaks than the currents IP1, IP2 flowing through the conventional level shifters.

The current IP1 abruptly rises at time point T7 and flows for a predetermined time period, while the current ILD1 according to an embodiment rises at time point T8 and flows for a predetermined time period. The current ILD1 has a lower peak than the peak of the current IP1.

While the current IP2 abruptly rises at time point T9 and flows for a predetermined time period, the current ILD2 according to the embodiment rises at time point T10 and flows for a predetermined time point. The current ILD2 has a lower peak than the peak of the current IP2.

As explained above, considering the currents flowing through the level shifter which are lower than ones in a related art, the power consumption can also be improved according to the embodiments.

The SOA is wider, when the gate-source voltage of the high voltage device of the level shifter is lower. That is, as the gate-source voltage of the high voltage device is lower, the possibility is lower that the high voltage device operates out of the SOA.

In the pulse generator according to the embodiments, a lower level of pulse signals can be generated by the NMOS and the clamp inverter, and the pulse signals are delivered to the gate of the high voltage device through the NMOS source follower. The source follower is suitable for use as a voltage buffer, and by the Miller's effect, the input capacitance is decreased. As a result, propagation delay can be reduced. As the gate voltage of the high voltage device of the level shifter is decreased, compared to a related art, the peak current is decreased, power consumption is reduced, and the possibility of operating outside the SOA can be decreased.

Although the exemplary embodiments of the present invention are described above in detail, the spirit or scope of the invention is not limited thereto. All various modifications by those of ordinary skill in the art using the spirit or scope of the invention of the appended claims and equivalents may belong to the scope of the right of the present invention.

DESCRIPTION OF SYMBOLS

10: Short pulse generator
20: first pulse generator
25: second pulse generator
30: first level shifter
35: second level shifter
40: logic reshaper
21, 22: inverter
23: clamp inverter
24, 27, 28, 29: temperature compensator
25, 26, 31: zener diode
32, 35: current source
33: clamping circuit

What is claimed is:

1. A pulse generator, comprising:
a first inverter configured to invert an input pulse and output a result;
a second inverter configured to invert the output of the first inverter and output a result;
a clamp inverter configured to generate a clamping voltage by clamping the output of the second inverter and generate an output pulse through a source follower which operates according to the clamping voltage, wherein the clamp inverter includes at least a first Zener diode coupled to the output of the second inverter; and
a temperature compensator configured to compensate for variations in the clamping voltage caused by a temperature change, wherein the temperature compensator is coupled to an anode of the first Zener diode and has a polarity opposite to a temperature coefficient of the first Zener diode according to a temperature rise.

2. The pulse generator of claim 1, wherein the clamp inverter comprises:
a first zener diode comprising a cathode coupled to the output of the second inverter; and
a first transistor comprising a gate coupled to the output of the second inverter, a first electrode coupled to an output node of the clamp inverter, and a second electrode coupled to a first voltage, wherein the first transistor is configured to implement the source follower.

3. The pulse generator of claim 2, wherein the clamp inverter further comprises a second zener diode coupled between the output node and a ground.

4. The pulse generator of claim 2, wherein the clamp inverter further comprises a second transistor coupled between the output node and a ground, wherein the second transistor is configured to switch according to the output of the first inverter.

5. The pulse generator of claim 4, wherein the first and the second transistors are NMOS transistors.

6. The pulse generator of claim 1, wherein the temperature compensator comprises a first electrode coupled to a ground, a second electrode coupled to an anode of the first zener diode, and a third transistor which is diode-connected.

7. The pulse generator of claim 6, wherein the third transistor is a MOSFET.

8. The pulse generator of claim 6, wherein the third transistor is a BJT.

9. The pulse generator of claim 1, wherein
the temperature compensator comprises at least one or more diodes comprising an anode coupled to an anode of the first zener diode.

10. The pulse generator of claim 2, wherein the second inverter comprises:
a fourth transistor coupled between the first voltage and the output of the second inverter, to switch according to the output of the first inverter; and
a fifth transistor coupled between the output of the second inverter and a ground, to switch according to the output of the first inverter.

11. The pulse generator of claim 10, further comprising a current source coupled between the first voltage and the fourth transistor to supply a constant current.

12. The pulse generator of claim 11, wherein the current source comprises a first electrode coupled to the first voltage, a second electrode coupled to the fourth transistor, and a sixth transistor comprising a gate to which a predetermined voltage is inputted.

13. The pulse generator of claim 1, wherein the clamp inverter comprises:
a plurality of diodes coupled between the output of the second inverter and a ground; and
a first transistor comprising a gate coupled to the output of the second inverter, a first electrode coupled to an output node of the clamp inverter, and a second electrode coupled to a first voltage, wherein the first transistor is configured to implement the source follower.

14. The pulse generator of claim 1, wherein the clamp inverter comprises:
a current source coupled between the output of the second inverter and a ground; and
a first transistor comprising a gate coupled to the output of the second inverter, a first electrode coupled to an output node of the clamp inverter, and a second electrode coupled to a first voltage, wherein the first transistor is configured to implement the source follower.

* * * * *